(12) United States Patent
Ishihara et al.

(10) Patent No.: US 7,791,016 B2
(45) Date of Patent: Sep. 7, 2010

(54) PHOTODETECTOR

(75) Inventors: Masatoshi Ishihara, Hamamatsu (JP); Nao Inoue, Hamamatsu (JP); Hiroo Yamamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/259,740

(22) Filed: Oct. 28, 2008

(65) Prior Publication Data

US 2009/0108181 A1 Apr. 30, 2009

(30) Foreign Application Priority Data

Oct. 29, 2007 (JP) .......................... P2007-280861
Oct. 29, 2007 (JP) .......................... P2007-280863

(51) Int. Cl.
*H01J 40/14* (2006.01)
*H01L 27/00* (2006.01)
*H01L 31/00* (2006.01)
*H01L 31/062* (2006.01)

(52) U.S. Cl. ................. 250/239; 250/208.1; 250/214.1; 257/294

(58) Field of Classification Search ............. 250/208.1, 250/214.1, 214 R, 239, 216, 221; 257/292, 257/294, 431–436, 735–738, 772–784; 348/841–842
See application file for complete search history.

(56) References Cited

U.S. PATENT DOCUMENTS

| 6,019,523 | A | * | 2/2000 | Honmou | ....................... 385/94 |
| 6,495,814 | B1 | * | 12/2002 | Suzuki et al. | ............. 250/208.1 |
| 6,828,545 | B1 | | 12/2004 | Hamilton et al. | |
| 2004/0201815 | A1 | * | 10/2004 | Yamamoto | ................... 349/156 |

FOREIGN PATENT DOCUMENTS

JP 2004-179205 6/2004
JP 2005-243714 9/2005

* cited by examiner

*Primary Examiner*—Georgia Y Epps
*Assistant Examiner*—Don Williams
(74) *Attorney, Agent, or Firm*—Drinker Biddle & Reath LLP

(57) ABSTRACT

A photodetector includes a plurality of photodetecting elements which output electrical signals corresponding to the intensities of light that entered these; a signal processing element which is opposed to the photodetecting elements and is connected to the photodetecting elements via conductive bumps, and into which electrical signals output from the photodetecting elements are input; a resin which has electrical insulation and is filled in at least at the gaps between the photodetecting elements and the signal processing element; and a light shielding member arranged so as to cover the surfaces exposed from the photodetecting elements and the signal processing element in the resin.

14 Claims, 3 Drawing Sheets

PHOTODETECTOR

BACKGROUND OF THE INVENTION

1. Field of the Invention

The present invention relates to a photodetector.

2. Related Background Art

A photodetector which includes a plurality of photodetecting elements and a signal processing element into which electrical signals output from these photodetecting elements are input, is known (for example, refer to U.S. Pat. No. 6,828,545). In the photodetector described in U.S. Pat. No. 6,828,545, a signal processor is opposed to the respective photodetecting elements and connected to the photodetecting elements via conductive bumps, and an electrical insulating resin is filled in the gaps between the respective photodetecting elements and the signal processing element.

SUMMARY OF THE INVENTION

However, in the photodetector described in U.S. Pat. No. 6,828,545, stray light occurs, and this stray light enters the photodetecting elements and is detected as noise. In other words, in the photodetector described in U.S. Pat. No. 6,828,545, when light enters from the surfaces exposed from the photodetecting elements and the signal processing element in the above-described resin, the light is scattered by the surfaces and transmitted through the resin and reflected on the surface of the signal processing element (surface opposed to the photodetecting elements), and these scattered light and reflected light become stray light and may enter from the back surface (surface opposed to the signal processing element) or the side surfaces of the photodetecting element.

Therefore, the present invention has been made in view of these circumstances, and an object thereof is to provide a photodetector which can have high accuracy of light detection in the measurement by preventing stray light from occurring and entering the photodetecting elements.

A photodetector of the present invention includes a plurality of photodetecting elements which output electrical signals corresponding to the intensities of light that entered these; a signal processing element which is opposed to the plurality of photodetecting elements and is connected to the plurality of photodetecting elements via conductive bumps, and into which electrical signals output from the plurality of photodetecting elements are input; a resin which has electrical insulation and is filled in at least at the gaps between the plurality of photodetecting elements and the signal processing element; and a light shielding member arranged so as to cover the surfaces exposed from the plurality of photodetecting elements and the signal processing element in the resin.

In the photodetector of the present invention, a light shielding member is arranged so as to cover the surfaces exposed from the photodetecting elements and the signal processing element in the resin filled in the gaps between the plurality of photodetecting elements and the signal processing element, so that entering of light from the surfaces exposed from the photodetecting elements and the signal processing element in the resin is suppressed, and occurrence of stray light can be prevented. Accordingly, no stray light occurs and is detected as noise, and the photodetector can have high accuracy of light detection in measurement.

It is preferable that the plurality of photodetecting elements are arranged at predetermined intervals, the resin covers a region corresponding to the area between the photodetecting elements in the signal processing element, and the light shielding member is arranged so as to cover the surface of the portion covering the region in the resin. In this case, even in the construction in which the region corresponding to the area between the photodetecting elements in the signal processing element is covered by the resin, the light shielding member is arranged so as to cover the surface of the portion covering the region in the resin, so that entering of light from the surface of the portion covering the region in the resin is suppressed, and occurrence of stray light can be prevented.

It is preferable that the light shielding member is arranged so as to cover the side surfaces of the plurality of photodetecting elements. In this case, stray light from the side surfaces of the photodetecting elements can be suppressed. As a result, the photodetector can have the higher accuracy of light detection in the measurement.

It is preferable that the signal processing element includes first regions opposed to the plurality of photodetecting elements and second regions positioned on the outer peripheral sides of the first regions, the resin covers the second regions, and the light shielding member is arranged so as to cover the surfaces of portions covering the second regions in the resin. In this case, even in the construction in which the second regions are covered by the resin, entering of light from the surfaces of the portions covering the second regions in the resin is suppressed, and occurrence of stray light can be prevented.

Preferably, the light shielding member is a resin layer containing a filler having a light shielding effect, and more preferably, the light shielding member shields incident light by absorbing it.

It is preferable that the conductive bumps are made of solder, and are formed by dipping into molten solder.

A photodetector of the present invention includes a plurality of photodetecting elements which output electrical signals corresponding to intensities of light that entered these; a signal processing element which is opposed to the plurality of photodetecting elements and is connected to the plurality of photodetecting elements via conductive bumps, and into which electrical signals output from the plurality of photodetecting elements are input; and a resin which has electrical insulation and a light shielding effect, and is filled in at least at the gaps between the plurality of photodetecting elements and the signal processing element.

In the photodetector of the present invention, the resin having a light shielding effect is filled in at least at the gaps between the plurality of photodetecting elements and the signal processing element, so that even when stray light occurs, the stray light can be prevented from entering from the surface sides opposed to the signal processing element in the photodetecting elements. Accordingly, noise to be detected can be reduced, and the photodetector can have the high accuracy of light detection in the measurement.

It is preferable that the plurality of photodetecting elements are arranged at predetermined intervals, and the resin is arranged so as to cover a region corresponding to the area between the photodetecting elements in the signal processing element. In this case, it is suppressed that light enters the signal processing element from the area between the plurality of photodetecting elements, and occurrence of stray light can be prevented.

It is preferable that the resin is arranged so as to cover the side surfaces of the plurality of photodetecting elements. In this case, stray light from the side surfaces of the photodetecting elements can be suppressed. As a result, the photodetector can have higher accuracy of light detection in the measurement.

It is preferable that the signal processing element includes first regions opposed to the plurality of photodetecting elements and second regions positioned on the outer peripheral sides of the first regions, and the resin is arranged so as to cover the second regions. In this case, it is suppressed that light enters the second regions in the signal processing element, and occurrence of stray light can be prevented.

It is preferable that the resin has a light shielding effect by containing a filler with a light shielding effect, and further, has a light shielding effect by absorbing incident light.

It is preferable that the conductive bumps are columnar, and the aspect ratio thereof is set to be not less than 1.

The present invention can provide a photodetector which can have high accuracy of light detection in the measurement by preventing stray light from occurring and entering the photodetecting elements.

DESCRIPTION OF THE PREFERRED EMBODIMENTS

Hereinafter, preferred embodiments of the present invention will be described in detail with reference to the accompanying drawings. In the description, the same symbol is used for identical elements or elements having the same function, and overlapping description is omitted.

First Embodiment

Figure 1:
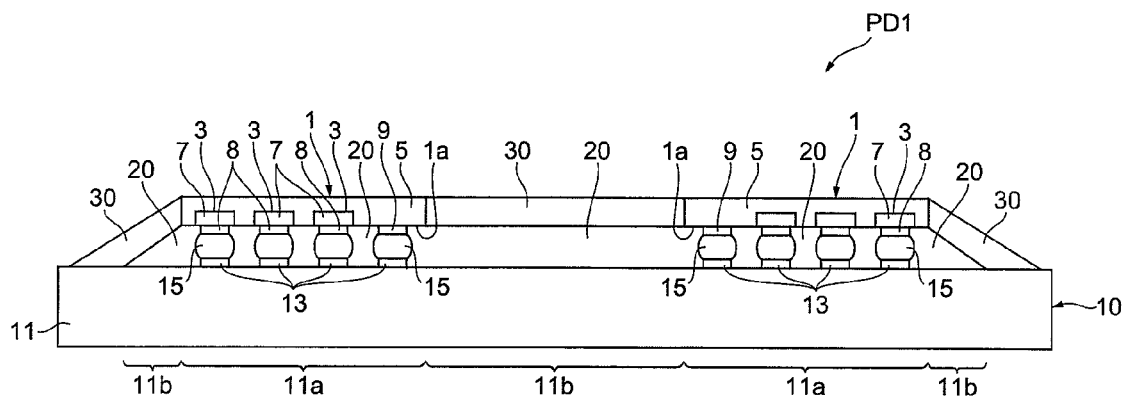
FIG. 1 is a schematic view showing a sectional construction of a photodetector according to a first embodiment.

A construction of a photodetector according to a first embodiment will be described with reference to FIG. 1. FIG. 1 is a schematic view showing a sectional construction of the photodetector according to the first embodiment. The photodetector PD1 includes a plurality of photodetecting elements 1, a signal processing element 10, a resin 20, and a light shielding member 30.

The photodetecting elements 1 are arranged at predetermined intervals and opposed to the signal processing element 10. The photodetecting elements 1 are one-dimensionally or two-dimensionally aligned. The photodetecting elements 1 have a plurality of pn junction regions 3 aligned on the main surface 1a side opposed to the signal processing element 10, and the pn junction regions 3 function as photosensitive regions of the photodetecting elements 1.

The photodetecting element 1 is a so-called photodiode array, and has an n-type (first conductivity type) semiconductor substrate 5 made of Si. On the n-type semiconductor substrate 5, on the main surface 1a side, a plurality of p-type (second conductivity type) regions 7 are (one-dimensionally or two-dimensionally) aligned like an array. The pn junction regions 3 formed between the respective p-type regions 7 and n-type semiconductor substrate 5 form photosensitive regions of each photodiode.

On the main surface 1a, electrodes 8 and 9 as under bump metals (UBM) are arranged. The electrode 8 is electrically connected to the corresponding p-type region 7. The electrode 9 is electrically connected to the n-type semiconductor substrate 5. The electrodes 8 and 9 are formed by plating, for example, Ni and Au in order on the electrode wiring (not shown) connected to the p-type regions 7 or the n-type semiconductor substrate 5.

When light enters the photodetecting elements 1, carriers are generated on the p-type regions 7 which the light entered according to the intensities of the incident light. Photocurrents caused by the generated carriers are taken out from the electrodes 8 connected to the p-type regions 7. Accordingly, the respective photodetecting elements 1 output electrical signals corresponding to the intensities of the incident light.

The photodetecting elements 1 are not limited to the photodiode arrays constructed as described above, and any detecting elements can be used as long as they are quantum-type detecting elements or thermal-type detecting elements, etc., having pn junctions. As the quantum-type detecting elements, in addition to detecting elements such as Si photodiode arrays, photovoltaic-type detecting elements of InGaAs, GaAs, AlGaAs, InSb, HgCdTe, InAsSn, or the like, or photoconductive-type detecting elements of PbS, PbSe, InSb, HgCdTe, or the like can be used. As the thermal-type detecting elements, thermopiles, bolometers, pneumatic cells, or the like can be used. The structure of the quantum-type detecting elements may be an MQW (multiple-quantum-well) structure. The structure of the thermal-type detecting elements may be a membrane structure.

As described above, the signal processing element 10 is opposed to the photodetecting elements 1, and includes a signal readout circuit, a signal processing circuit, and a signal output circuit (all of these are not shown), etc. In the first embodiment, the signal processing element 10 has a substrate 11 made of semiconductor crystals of Si, GaAs, etc., and the circuits are formed on the substrate 11. The signal processing element 10 may be formed by a wiring pattern made of a wiring material such as ceramics or PCB, etc.

The substrate 11 includes first regions 11a opposed to the photodetecting elements 1 and second regions 11b positioned on the outer peripheral sides of the first regions 11a. On the surface sides opposed to the photodetecting elements 1 in the first regions 11a, corresponding to the electrodes 8 and 9, a plurality of electrodes 13 as under bump metals (UBM) are arranged. The electrodes 13 are formed by plating, for example, Ni and Au in order on the electrode wiring (not shown) connected to the signal readout circuit, etc.

The corresponding electrodes 8 and 9 and the electrode 13 are electrically and physically connected to each other by conductive bumps 15. Accordingly, the photodetecting elements 1 and the signal processing element 10 are electrically connected to each other via the electrodes 8, 9, and 13 and the conductive bumps 15. Into the signal processing element 10, electrical signals output from the photodetecting elements 1 are input.

The conductive bumps 15 are made of solder. The conductive bumps 15 can be formed through the following steps. First, the electrodes 8 and 9 of each photodetecting element 1 are dipped in molten solder and solder electrodes are formed on the electrodes 8 and 9. Then, each photodetecting element 1 is placed on the signal processing element 10 so that the solder electrodes come into contact with the corresponding electrode 13 of the signal processing element 10, and then heated to melt the solder electrodes.

The resin 20 has electrical insulation and is filled in the gaps between the photodetecting elements 1 and the signal processing element 10. The resin 20 secures mechanical strength of the conductive bumps 15, prevents mixture of foreign matter into the gaps between the photodetecting elements 1 and the signal processing element 10, and functions as an underfill material. In the first embodiment, the resin 20 covers the second regions 11b. As the resin 20, for example, an epoxy-based resin, a urethane-based resin, a silicone-based resin, or an acrylic-based resin, or a composite of these resins can be used.

The light shielding member 30 is arranged so as to cover surfaces exposed from the photodetecting elements 1 and the signal processing element 10 in the resin 20. In the first embodiment, the light shielding member 30 covers the surfaces of portions covering the second regions 11b in the resin 20. Further, the light shielding member 30 also covers side surfaces of the photodetecting elements 1.

The light shielding member 30 is a resin layer containing a filler (for example, carbon particles, alumina particles, PbS, or PbSe, etc.) having a light shielding effect. When a material which shows light absorption performance in a predetermined wavelength band such as PbS or PbSe is used as the filler, the light shielding member 30 shields incident light by absorbing it. The light shielding member 30 may shield incident light by reflecting it, however, there is a possibility that the reflected light becomes stray light, so that it is preferable that the light shielding member 30 shields incident light by absorbing it. The light shielding member 30 can be formed by applying a resin containing a filler with a light shielding effect on the surfaces exposed from the photodetecting elements 1 and the signal processing element 10 in the resin 20.

As described above, in the first embodiment, the light shielding member 30 is arranged so as to cover the surfaces exposed from the photodetecting elements 1 and the signal processing element 10 in the resin 20 filled in the gaps between the photodetecting elements 1 and the signal processing element 10, so that entering of light from the surfaces exposed from the photodetecting elements 1 and the signal processing element 10 in the resin 20 is suppressed, and occurrence of stray light can be prevented. Accordingly, stray light can be prevented from entering the photodetecting elements 1 and being detected as noise, and the photodetector PD 1 can have the high accuracy of light detection in the measurement.

Figure 2:
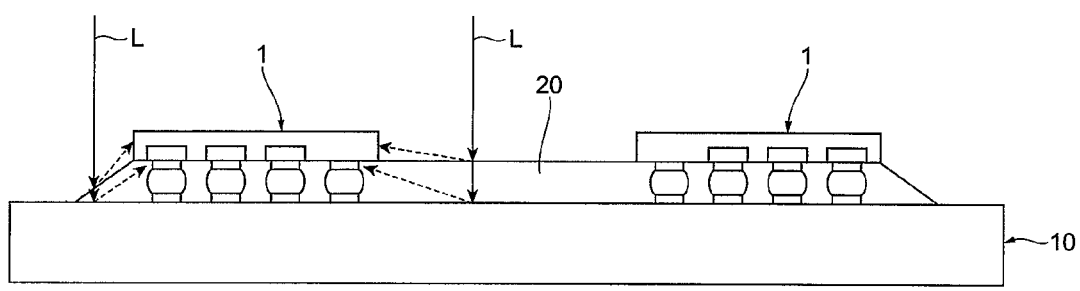
FIG. 2 is a schematic view for describing a state where stray light enters the photodetecting elements.

In a case where the photodetecting member 30 is absent, as shown in FIG. 2, when light L enters from the surfaces exposed from the photodetecting elements 1 and the signal processing element 10 in the resin 20, the light is scattered by these surfaces, transmitted through the resin 20, and reflected by the surfaces opposed to the photodetecting elements 1 in the signal processing element 10. Then, these scattered light and reflected light (shown by the dashed lines in the figure) become stray light and may enter from the main surface opposed to the signal processing element 10 or side surfaces of the photodetecting element 1. On the other hand, in the first embodiment, as described above, these stray lights do not occur.

In the first embodiment, the light shielding member 30 is arranged so as to cover the surfaces of portions covering a region corresponding to the area between the photodetecting elements 1 of the second regions 11b in the resin 20. Accordingly, even in the construction in which the region corresponding to the area between the photodetecting elements 1 of the second regions 11b is covered by the resin 20, the light shielding member 30 is arranged so as to cover the surface of the portion covering the region in the resin 20, so that entering of light from the surface of the portion covering the region in resin 20 is suppressed, and occurrence of stray light can be prevented.

In the first embodiment, the light shielding member 30 is arranged so as to cover the surfaces of portions covering regions corresponding to outer edge portions of the substrate 11 of the second regions 11b in the resin 20. Accordingly, even in the construction in which the regions corresponding to the outer edge portions of the substrate 11 of the second regions 11b are covered by the resin 20, the light shielding member 30 is arranged so as to cover the surfaces of the portions covering these regions in the resin 20, so that entering of light from the surfaces of the portions covering the regions in the resin 20 is suppressed, and occurrence of stray light can be prevented.

In the first embodiment, the light shielding member 30 is arranged so as to cover the side surfaces of the photodetecting elements 1. Accordingly, entering of stray light from the side surfaces of the photodetecting elements 1 can be suppressed. As a result, the photodetector PD1 can have higher accuracy of light detection in the measurement. In particular, in the first embodiment, the light shielding member 30 covers up to the upper ends of the photodetecting elements 1 (the ends of the main surfaces opposed to the main surfaces 1a opposed to the signal processing element 10), so that entering of stray light can be more reliably prevented.

In the first embodiment, the conductive bumps 15 (solder electrodes) are formed by dipping into molten solder (hereinafter, referred to as dip method). According to the dip method, in comparison with other forming methods, the conductive bumps 15 can be easily formed at low cost, however, it becomes difficult to make the conductive bumps 15 stably high. To form conductive bumps 15 with stable heights (for example, with an aspect ratio not less than 1), it is necessary to set the intervals (pitches) of the electrodes 8, 9, and 13 to a value larger than 30 micrometers. Herein, the "aspect ratio" shows a value obtained by dividing the height of the conductive bumps 15 by the width of the end portions in the height direction of the conductive bumps 15. Forming methods other than the above-described dip method are a method of forming by means of vapor deposition using a thick-film resist or a two-layer resist or anisotropic plating, etc., an ink-jet method (for example, refer to Japanese Published Unexamined Patent Application No. 2004-179205), and a pyramid method (for example, refer to Japanese Published Unexamined Patent Application No. 2005-243714), etc.

Regarding the electrodes 8, 9, and 13, the pitches, the sizes (areas and shapes), and the heights thereof and the height and the shape of the conductive bumps 15 are not determined independently, but are determined depending on a material to be used for the conductive bumps 15 and a forming method thereof, and the sizes and warps during production of the photodetecting elements 1 and the signal processing element 10. Various values can be used as intervals (pitches) of the p-type regions 7 depending on the use of output signals from the photodetecting elements 1.

Therefore, when the intervals (pitches) of the electrodes 8, 9, and 13 are set to values not more than 30 micrometers, the degree of freedom in design of heights and areas of the electrodes 8, 9, and 13 is reduced, and it becomes difficult to obtain stably high bumps (with an aspect ratio not less than 1) as the conducting pumps 15. In this case, the interval between the photodetecting elements 1 and the signal processing element 10 becomes very small. Therefore, it is difficult to fill the resin containing the filler with a light shielding effect into the gaps between the photodetecting element 1 and the signal processing element 10. In the first embodiment, the resin 20 does not contain the filler, so that it can be easily filled into the gaps between the photodetecting elements 1 and the signal processing element 10. Then, by the light shielding member 30, occurrence of stray light is suppressed. In other words, in the first embodiment, upon securing mechanical strength of the conductive bumps 15, occurrence of stray light is suppressed.

Figure 3:
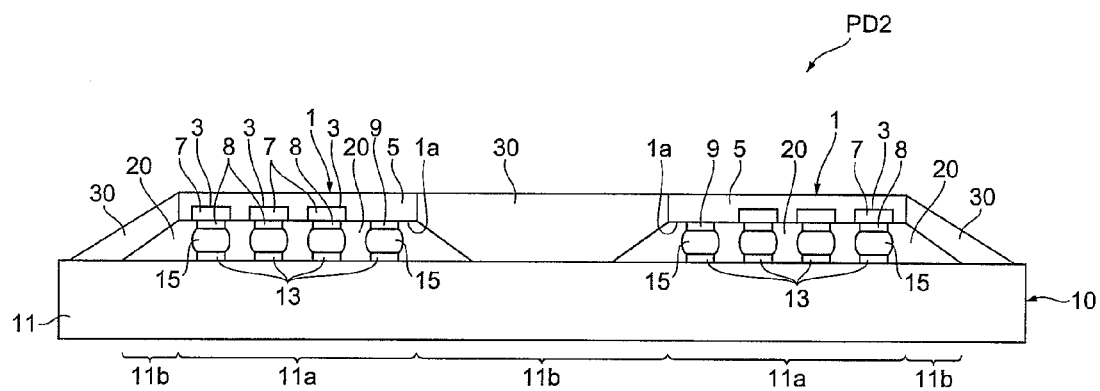
FIG. 3 is a schematic view showing a sectional construction of a photodetector according to an exemplary variation of the first embodiment.

Next, based on FIG. 3, a photodetector PD2 according to an exemplary variation of the first embodiment will be described. The photodetector PD2 of this exemplary variation is different from the above-described photodetector PD1 in construction of the resin 20. FIG. 3 is a schematic view showing the sectional construction of the photodetector according to an exemplary variation of the first embodiment. The photodetector PD2 includes, similar to the photodetector PD1, a plurality of photodetecting elements 1, a signal processing element 10, a resin 20 and a light shielding member 30.

In this exemplary variation, the region corresponding to the area between the photodetecting elements 1 of the second regions 11b in the signal processing element 10 is not covered by the resin 20. The light shielding member 30 is arranged so as to cover the region corresponding to the area between the photodetecting elements 1 of the second regions 11b and side surfaces of the photodetecting elements 1 between the photodetecting elements 1.

As described above, even in this exemplary variation, similar to the first embodiment, entering of light from the surfaces exposed from the photodetecting elements 1 and the signal processing element 10 in the resin 20 is suppressed by the light shielding member 30, and occurrence of stray light can be prevented. Therefore, no stray light enters the photodetecting elements 1 and is detected as noise, so that the photodetector PD2 can have high accuracy of light detection in the measurement.

Second Embodiment

Figure 4:
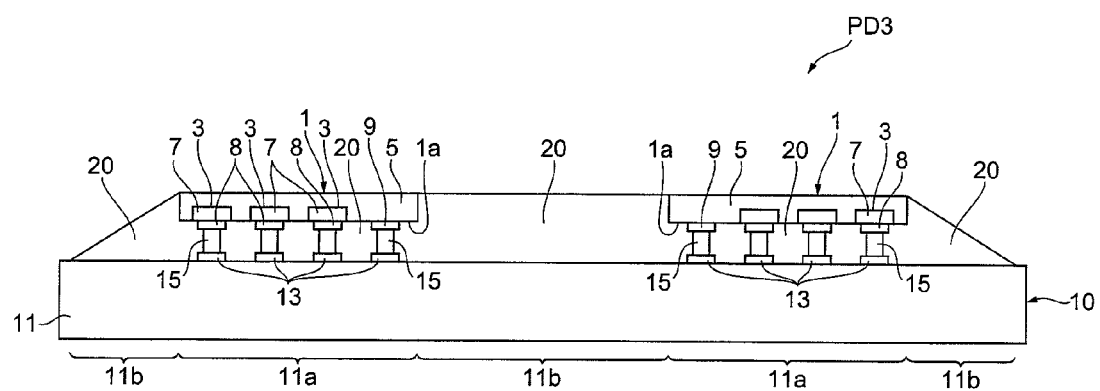
FIG. 4 is a schematic view showing a sectional construction of a photodetector according to a second embodiment.

A construction of a photodetector according to a second embodiment will be described with reference to FIG. 4. FIG. 4 is a schematic view showing a sectional construction of the photodetector according to the second embodiment. The photodetector PD3 includes a plurality of photodetecting elements 1, a signal processing element 10, and a resin 20.

The photodetecting elements 1 are arranged at predetermined intervals and opposed to the signal processing element 10. The photodetecting elements 1 are one-dimensionally or two-dimensionally aligned. The photodetecting elements 1 have a plurality of pn junction regions 3 aligned on the main surface 1a side opposed to the signal processing element 10, and the pn junction regions 3 function as photosensitive regions of the photodetecting elements 1.

The photodetecting element 1 is a so-called photodiode array, and has an n-type (first conductivity type) semiconductor substrate 5 made of Si. On the n-type semiconductor substrate 5, on the main surface 1a side, a plurality of p-type (second conductivity type) regions 7 are (one-dimensionally or two-dimensionally) aligned like an array. The pn junction regions 3 formed between the respective p-type regions 7 and n-type semiconductor substrate 5 form photosensitive regions of each photodiode.

On the main surface 1a, electrodes 8 and 9 as under bump metals (UBM) are arranged. The electrode 8 is electrically connected to the corresponding p-type region 7. The electrode 9 is electrically connected to the n-type semiconductor substrate 5. The electrodes 8 and 9 are formed by plating, for example, Ni and Au in order on the electrode wiring (not shown) connected to the p-type regions 7 or the n-type semiconductor substrate 5.

When light enters the photodetecting elements 1, carriers are generated on the p-type regions 7 which the light entered according to the intensities of the incident light. Photocurrents caused by the generated carriers are taken out from the electrodes 8 connected to the p-type regions 7. Accordingly, the respective photodetecting elements 1 output electrical signals corresponding to the intensities of the incident light.

The photodetecting elements 1 are not limited to the photodiode arrays constructed as described above, and any detecting elements can be used as long as they are quantum-type detecting elements or thermal-type detecting elements, etc., having pn junctions. As the quantum-type detecting elements, in addition to detecting elements such as Si photodiode arrays, photovoltaic-type detecting elements of InGaAs, GaAs, AlGaAs, InSb, HgCdTe, InAsSn, or the like, or photoconductive-type detecting elements of PbS, PbSe, InSb, HgCdTe, or the like can be used. As the thermal-type detecting elements, thermopiles, bolometers, pneumatic cells, or the like can be used. The structure of the quantum-type detecting elements may be an MQW (multiple-quantum-well) structure. The structure of the thermal-type detecting elements may be a membrane structure.

As described above, the signal processing element 10 is opposed to the photodetecting elements 1, and includes a signal readout circuit, a signal processing circuit, and a signal output circuit (all of these are not shown), etc. In the first embodiment, the signal processing element has a substrate 11 made of semiconductor crystals of Si, GaAs, etc., and the circuits are formed on the substrate 11. The signal processing element 10 may be formed by a wiring pattern made of a wiring material such as ceramics or PCB, etc.

The substrate 11 includes first regions 11a opposed to the photodetecting elements 1 and second regions 11b positioned on the outer peripheral sides of the first regions 11a. On the surface sides opposed to the photodetecting elements 1 in the first regions 11a, corresponding to the electrodes 8 and 9, a plurality of electrodes 13 as under bump metals (UBM) are arranged. The electrodes 13 are formed by plating, for example, Ni and Au in order on the electrode wiring (not shown) connected to the signal readout circuit, etc.

The corresponding electrodes 8 and 9 and the electrode 13 are electrically and physically connected to each other by conductive bumps 15. Accordingly, the photodetecting elements 1 and the signal processing element 10 are electrically connected to each other via the electrodes 8, 9, and 13 and the conductive bumps 15. Into the signal processing element 10, electrical signals output from the photodetecting elements 1 are input. The signal processing element 10 generally includes an IC, etc., in its signal processing circuit, and it generates heat and radiates infrared rays when operating.

Regarding the electrodes 8, 9, and 13, the intervals (pitches) between the electrodes, the sizes (areas and shapes), and the heights thereof and the height and shape of the conductive bumps 15 are not determined independently, but are determined depending on the material to be used for the conductive bumps 15 and a forming method thereof, and the sizes and warps during production of the photodetecting elements 1 and the signal processing element 10. Various values can be used as intervals (pitches) of the p-type regions 7 depending on the use of the output signals from the photodetecting elements 1.

The conductive bumps 15 are columnar, and an aspect ratio thereof is set to be not less than 1. Herein, the "aspect ratio" shows a value obtained by dividing the height of the conductive bumps 15 by the width of the end portions in the height direction of the conductive bumps 15. The conductive bumps 15 are formed by means of a vapor deposition method using a thick-film resist or a two-layer resist, a method in which growth of plating in the horizontal direction of the bumps is selectively suppressed, an ink-jet method (for example, refer to Japanese Published Unexamined Patent Application No. 2004-179205), or a pyramid method (for example, refer to Japanese Published Unexamined Patent Application No. 2005-243714), etc. By anisotropically growing the bumps according to these methods, columnar bumps with a high aspect ratio can be formed.

The resin 20 has electrical insulation and is filled in the gaps between the photodetecting elements 1 and the signal processing element 10. The resin 20 secures mechanical strength of the conductive bumps 15, prevents mixture of foreign matter into the gaps between the photodetecting elements 1 and the signal processing element 10, and functions as an underfill material. The resin 20 covers the second regions 11b, and further covers the side surfaces of the photodetecting elements 1. As the resin 20, for example, an epoxy-based resin, a urethane-based resin, a silicone-based resin, or an acrylic-based resin, or a composite of these resins can be used.

The resin 20 is made of a resin containing a filler (for example, carbon particles, alumina particles, PbS, or PbSe, etc.) having a light shielding effect. When a material which shows light absorption performance in a predetermined wavelength band such as PbS or PbSe is used as the filler, the resin 20 shields incident light by absorbing it. The resin 20 may shield incident light by reflecting it, however, there is a possibility that the reflected light becomes stray light, so that it is preferable that the resin shields incident light by absorbing it. The resin 20 may be formed by applying a resin containing the filler onto the first regions 11a and the second regions 11b so as to fill the gaps between the photodetecting elements 1 and the signal processing element 10 and curing it, or formed by further applying the resin onto the surfaces exposed from the photodetecting elements 1 and the signal processing element 10 after the resin is filled in the gaps between the photodetecting elements 1 and the signal processing element 10 and cured.

As described above, in the second embodiment, the resin 20 is filled in the gaps between the photodetecting elements 1 and the signal processing element 10, so that even when stray light occurs, the stray light can be prevented from entering from the surface sides opposed to the signal processing element 10 in the photodetecting elements 1. Accordingly, noise to be detected can be reduced and the photodetector can have the high accuracy of light detection in measurement.

The signal processing element generates heat and radiates infrared rays in some cases of operating. Therefore, in the photodetector described in U.S. Pat. No. 6,828,545, when the photodetecting elements have sensitivity in the wavelength region of the infrared rays, the infrared rays radiated from the signal processing element enter from the back surface or side surfaces of the photodetecting element and are detected as noise.

However, in the second embodiment, the resin 20 is filled in the gaps between the photodetecting elements 1 and the signal processing element 10, so that even when the photodetecting elements 1 are infrared ray detecting elements having sensitivity in the wavelength region of the infrared rays, infrared rays radiated from the signal processing element 10 are prevented from entering from the surface sides opposed to the signal processing element 10 in the photodetecting elements 1 to reduce noise to be detected.

In the second embodiment, the resin 20 is arranged so as to cover the region corresponding to the area between the photodetecting elements 1 of the second regions 11b. Accordingly, entering of light into the region is suppressed, and occurrence of stray light can be prevented.

In the second embodiment, the resin 20 is arranged so as to cover the regions corresponding to outer edge portions of the substrate 11 of the second regions 11b. Accordingly, entering of light into the regions is suppressed, and occurrence of stray light can be prevented.

In the second embodiment, the resin 20 is arranged so as to cover the side surfaces of the photodetecting elements 1. Accordingly, entering of stray light from the side surfaces of the photodetecting elements 1 can be suppressed. As a result, the photodetector PD3 can have higher accuracy of light detection in measurement. In particular, in the second embodiment, the resin 20 covers up to the upper ends of the photodetecting elements 1 (the ends of the main surfaces opposed to the main surfaces 1a opposed to the signal processing element 10), and entering of stray light can be more reliably prevented.

Figure 5:
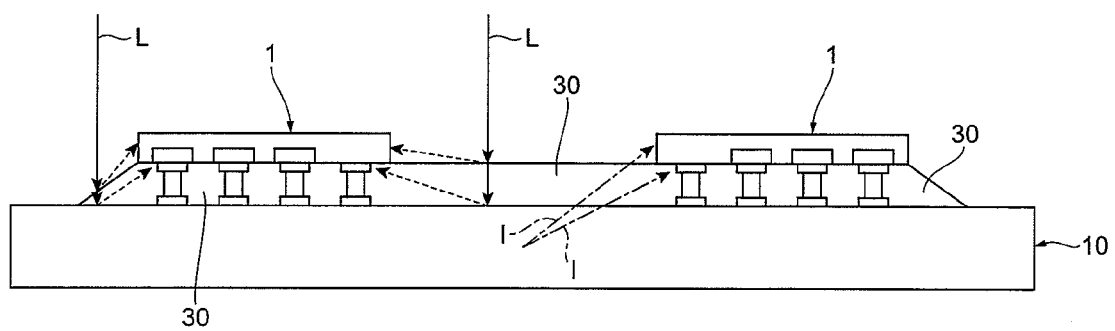
FIG. 5 is a schematic view for describing a state where stray light, etc., enter the photodetecting elements.

In the case where a resin 30 that does not have a light shielding effect is filled as an underfill material in the gaps between the photodetecting elements 1 and the signal processing element 10, as shown in FIG. 5, when light L enters from the surfaces exposed from the photodetecting elements 1 and the signal processing element 10, the light is scattered by these surfaces, transmitted through the resin 20, and reflected by the surface opposed to the photodetecting elements 1 in the signal processing element 10. Then, these scattered light and reflected light (shown by the dashed lines in the figure) become stray light and may enter from the main surface opposed to the signal processing element 10 or side surfaces of the photodetecting element 1. Further, infrared rays I (shown by the alternate long and short dashed line in the figure) radiated from the signal processing element 10 may enter from the back surface or the side surfaces of the photodetecting element 1. On the other hand, in the second embodiment, as described above, these stray lights do not occur, and infrared rays I radiated from the signal processing element 10 do not enter the photodetecting elements 1.

In the second embodiment, the aspect ratio of the conductive bumps 15 is set to be not less than 1. By thus setting the aspect ratio to be not less than 1, the interval between the photodetecting elements 1 and the signal processing element 10 becomes comparatively wide. Accordingly, the resin can be quickly and easily filled into the gaps between the photodetecting elements 1 and the signal processing element 10. In addition, even when the size of the filler contained in the resin 20 is large, the resin containing the filler can be filled into the gaps.

The photodetectors PD1 to PD3 are applicable to, for example, a non-dispersive infrared analyzer (NDIR) for gas analysis. As photodetecting elements of a miniature spectroscope using dispersive grating such as diffraction grating, photodetecting elements such as photodiode arrays or image sensors, etc., are used. To observe a continuous spectrum, photodiode arrays or image sensors formed of one chip are necessary, however, depending on the use, any photodiode arrays or image sensors may be used as long as they can detect a plurality of fixed wavelengths. For example, in the above-described non-dispersive infrared analyzer, the necessary sample wavelength and reference wavelength are determined in advance, and long, expensive photodiode arrays and image sensors including continuous pixels are not necessary. Therefore, by arranging a plurality of photodetecting elements whose number of pixels is small and which can detect necessary wavelengths, the cost of the photodetecting elements can be reduced. When a plurality of photodetecting elements are arranged on a continuous spectrum output from a diffraction grating, light reflected between the photodetecting elements become stray light and problems are posed. However, as described above, in the photodetectors PD1 to PD3, occurrence of stray light is suppressed, so that they can also be applied to the non-dispersive infrared analyzer, etc.

The above described the preferred embodiments of the present invention, but it is noted that the present invention is by no means limited to the above-described embodiments but can be modified in various ways without departing from the spirit and scope of the invention. For example, the number and alignment of the photodetecting elements 1 and the number and alignment of the p-type regions 7 are not limited to those shown. The photodetecting elements 1 may be formed by aligning n-type regions as photosensitive regions on a p-type semiconductor substrate.

In the photodetectors PD1 and PD2, the light shielding member 30 is not always required to cover the side surfaces of the photodetecting elements 1. However, as described above, to suppress entering of stray light from the side surfaces of the photodetecting elements 1, the light shielding member 30 must cover the side surfaces of the photodetecting elements 1.

In the photodetector PD3, the resin 20 is not always required to cover the side surfaces of the photodetecting elements 1. However, as described above, to suppress entering of stray light and infrared rays from the side surfaces of the photodetecting elements 1, the resin 20 must cover the side surfaces of the photodetecting elements 1.

What is claimed is:

1. A photodetector comprising:
   a plurality of photodetecting elements which output electrical signals corresponding to the intensities of light that entered these;
   a signal processing element which is opposed to the plurality of photodetecting elements and is connected to the plurality of photodetecting elements via conductive bumps, and into which electrical signals output from the plurality of photodetecting elements are input;
   a resin which has electrical insulation and is filled in at least at the gaps between the plurality of photodetecting elements and the signal processing element; and
   a light shielding member arranged so as to cover the surfaces exposed from the plurality of photodetecting elements and the signal processing element in the resin,
   wherein the light shielding member is arranged so as to cover the side surfaces of the plurality of photodetecting elements.

2. The photodetector according to claim 1, wherein
   the plurality of photodetecting elements are arranged at predetermined intervals,
   the resin covers a region corresponding to the area between the photodetecting elements in the signal processing element, and
   the light shielding member is arranged so as to cover the surface of the portion covering the region in the resin.

3. The photodetector according to claim 1, wherein
   the signal processing element includes first regions opposed to the plurality of photodetecting elements and second regions positioned on the outer peripheral sides of the first regions,
   the resin covers the second regions, and
   the light shielding member is arranged so as to cover the surfaces of portions covering the second regions in the resin.

4. The photodetector according to claim 1, wherein the light shielding member is a resin layer containing a filler having a light shielding effect.

5. The photodetector according to claim 1, wherein the light shielding member shields incident light by absorbing it.

6. The photodetector according to claim 1, wherein the conductive bumps are made of solder, and are formed by dipping into molten solder.

7. The photodetector according to claim 1, wherein the photodetector is a back-illuminated type device.

8. A photodetector comprising:
   a plurality of photodetecting elements which output electrical signals corresponding to intensities of light that entered these;
   a signal processing element which is opposed to the plurality of photodetecting elements and is connected to the plurality of photodetecting elements via conductive bumps, and into which electrical signals output from the plurality of photodetecting elements are input; and
   a resin which has electrical insulation and a light shielding effect, and is filled in at least at the gaps between the plurality of photodetecting elements and the signal processing element,
   wherein the resin is arranged so as to cover the side surfaces of the plurality of photodetecting elements.

9. The photodetector according to claim 8, wherein
   the plurality of photo detecting elements are arranged at predetermined intervals, and
   the resin is arranged so as to cover a region corresponding to the area between the photodetecting elements in the signal processing element.

10. The photodetector according to claim 8, wherein
    the signal processing element includes first regions opposed to the plurality of photodetecting elements and second regions positioned on the outer peripheral sides of the first regions, and
    the resin is arranged so as to cover the second regions.

11. The photodetector according to claim 8, wherein the resin has a light shielding effect by containing a filler with a light shielding effect.

12. The photodetector according to claim 8, wherein the resin has a light shielding effect by absorbing incident light.

13. The photodetector according to claim 8, wherein the conductive bumps are columnar, and the aspect ratio thereof is set to be not less than 1.

14. The photodetector according to claim 8, wherein the photodetector is a back-illuminated type device.

* * * * *